United States Patent [19]
Zinck et al.

[11] Patent Number: 5,188,671
[45] Date of Patent: Feb. 23, 1993

[54] MULTICHANNEL PLATE ASSEMBLY FOR GAS SOURCE MOLECULAR BEAM EPITAXY

[75] Inventors: Jennifer J. Zinck, Calabasas; James P. Baukus, Westlake Village, both of Calif.

[73] Assignee: Hughes Aircraft Company, Los Angeles, Calif.

[21] Appl. No.: 564,802

[22] Filed: Aug. 8, 1990

[51] Int. Cl.$^5$ ............ C23C 16/00; C23C 16/48
[52] U.S. Cl. ........................... 118/715; 118/726
[58] Field of Search ............ 118/715, 725, 726

[56] References Cited

U.S. PATENT DOCUMENTS

| | | | |
|---|---|---|---|
| 3,996,025 | 12/1976 | Gulden | 239/553.3 |
| 4,774,416 | 9/1988 | Askary | 250/492.2 |
| 4,792,378 | 12/1988 | Rose | 118/728 |

FOREIGN PATENT DOCUMENTS

| | | | |
|---|---|---|---|
| 3715644 | 12/1988 | Fed. Rep. of Germany | 118/726 |
| 57-48226 | 3/1982 | Japan . | |
| 60-98629 | 6/1985 | Japan | 156/345 |
| 60-116126 | 6/1985 | Japan | 118/728 |
| 61-87319 | 5/1986 | Japan | 118/728 |
| 63-187619 | 8/1988 | Japan | 118/723 |
| 2-73624 | 3/1990 | Japan | 118/724 |

OTHER PUBLICATIONS

Patent Abstracts of Japan, vol. 9, No. 218 (C-301) (1941) Sep. 5, 1985 & JP-A-60081 093 (Nippon Shinku Gijutsu K.K.), May 9, 1985.
Patent Abstracts of Japan, vol. 11, No. 300 (C-449) (2747) Sep. 29, 1987 & JP-A-62 091 496 (NEC Corp.) Apr. 25, 1987.
Patent Abstracts of Japan, vol. 10, No. 214 (C-362) (2270), Jul. 25, 1986 & JP-A-61 053 197 (Matsushita Electric Ind. Co.) Mar. 17, 1986.
Patent Abstracts of Japan, vol. 13, No. 101 (C-574) (3449), Mar. 9, 1989 & JP-A-63-277 591 (NEC Corp.) Nov. 15, 1988.

*Primary Examiner*—Richard Bueker
*Attorney, Agent, or Firm*—E. E. Leitereg; V. D. Duraiswamy; W. K. Denson-Low

[57] ABSTRACT

A microchannel plate array assembly (10), comprising an array of microchannels in a microchannel plate (24), is provided in place of a conventional effusion cell to attain high and uniform fluxes localized in the substrate area for the growth of films thereon by gas source molecular beam epitaxy. Using this approach, an effective pressure at the substrate can be sustained which is as much as 100 times greater than the background pressure in the growth chamber.

9 Claims, 1 Drawing Sheet

MULTICHANNEL PLATE ASSEMBLY FOR GAS SOURCE MOLECULAR BEAM EPITAXY

BACKGROUND OF THE INVENTION

1. Field of the Invention

The present invention is directed to gas source molecular beam epitaxy (GSMBE), and, more particularly, is directed to apparatus for enhancing the growth rate of films grown by GSMBE.

2. Description of Related Art

Conventional GSMBE gas handling techniques utilize electronic grade starting materials which are usually costly and/or hazardous; typically, the materials are pyrophoric. These materials are used to grow epitaxial films such as silicon from silane and germanium from germane. Presently, these techniques result in a growth rate of about 1 $\mu$m/hr.

Commercially available gas source cells contain a single aperture and are not capable of material delivery rates which would result in more desireable growth rates of 10 $\mu$m/hr. Growth rates on this order are typically realized in higher pressure, non-molecular flow environments in which a boundary layer develops at the growth surface and deposition may be diffusion-limited. Further, the higher pressure results in the unnecessary waste of costly starting materials, and, more importantly, increases the potential hazard of explosion.

It is desired to increase the growth rate while minimizing waste and the potential hazard of explosion of the starting material.

SUMMARY OF THE INVENTION

In accordance with the invention, a gas source cell for molecular beam epitaxial growth of a layer on a substrate is provided. The cell includes a multichannel plate array, comprising a plurality of openings which provide a collimated, collinear, collisionless flow of source molecules to the surface of the substrate.

The gas source cell of the invention concentrates the gas in a specific area (near the substrate) so as to avoid using enough gas that would be unduly wasteful or pose safety problems. Yet, the pressure in the rest of the growth chamber (the background pressure) may be kept lower than that near the surface. The higher gas pressure adjacent the surface results in an increase in local flux of source material to the substrate and hence an increase in growth of a species from the source material as a consequence of decomposition of the source gas.

DESCRIPTION OF THE PREFERRED EMBODIMENTS

Gas source MBE is being actively investigated as an alternative growth technique for the deposition of layered heterostructures because of the potential for high growth rates and rapid gas switching which would optimize interface abruptness. The microchannel plate assembly of the invention is capable of high material flux and uniformity and is compatible with ultra-high vacuum conditions and ultra-high purity gas handling techniques.

The present invention provides a gas source for use in GSMBE which would have the characteristics of uniformity, high flux for growth rates on the order of 10 $\mu$m/hr, and localization of that flux to the substrate in order that low background pressures in the growth chamber may be maintained. These features allow a significant enhancement over conventional GSMBE gas handling techniques in the utilization efficiency of electronic grade starting materials which are typically costly and/or hazardous. The approach afforded by the invention combines the features of molecular beam channel plate arrays and automatic pressure control for rapid gas switching to produce a high intensity, broad area, collimated gas source which is compatible with an ultra-high vacuum (UHV) environment and a molecular flow growth regime.

Figure 1:
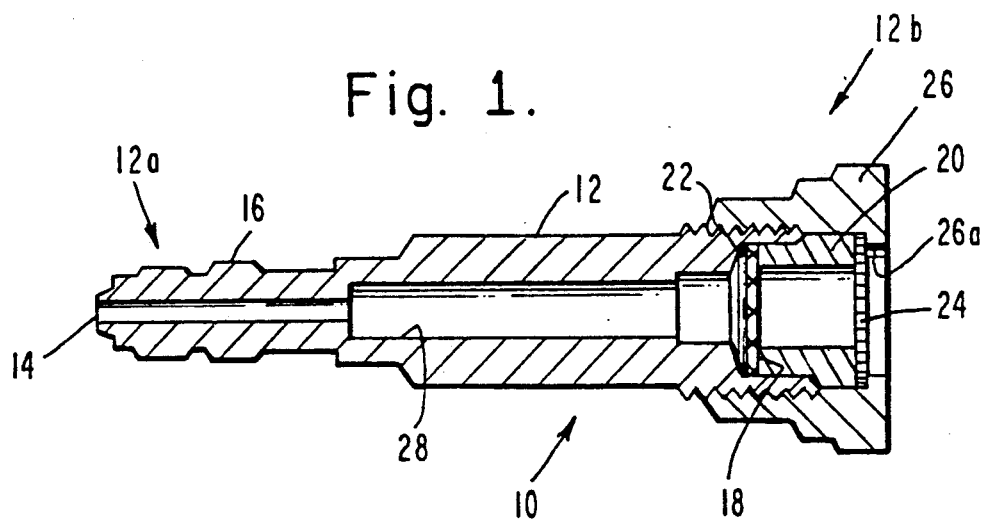
FIG. 1 is a cross-sectional view of the microchannel plate array assembly of the invention.

The present invention is directed to a novel approach to gas delivery for GSMBE which incorporates the following features:

(a) an ultra-high purity gas handling system which allows pressure and/or flow control/monitoring;

(b) a pressure reducing orifice for optimum effusive flow conditions;

(c) a filter baffle to ensure backing pressure uniformity;

(d) a laser-drilled microchannel plate array for the production of a collimated, high intensity, uniform gas source for CBE (chemical beam epitaxy) growth applications. A cross-sectional view of the microchannel plate array assembly 10 is depicted in FIG. 1.

The microchannel plate array assembly 10 comprises a body 12 having at a first end 12a the pressure reducing orifice 14. A VCR fitting 16 for connection to a gas reservoir (not shown) is provided on the body 12 at the first end 12a. At the opposite end 12b of the body 12 is provided a diffuser plate 18 for reducing beaming effects resulting from reducing gas pressure from about 1 atmosphere to a lower value such as 10$^{-3}$ Torr. The diffuser plate 18 is secured in place by a spacer 20. An 0-ring 22 may be used to provide a gas seal of the diffuser plate 18 to the inside channel of the body. The spacer 20 is held in place by the microchannel plate array 24, which in turn is held in place by a threaded cap 26, which is secured on threaded end 12b. It will be noted that the interior of the body is provided with a channel 28, as is common in gas source cells for the passage of the gas, and that the cap 26 is provided with an opening 26a for the same purpose.

It will be appreciated that the pressure reducing orifice 14 and the diffuser plate 18 can be eliminated if one can control gas pressure within the effusive limits selected. Further, a means (not shown) to permit pumping out the region between the diffuser plate 18 and the microchannel plate array 24 may be provided for rapid gas changing. Finally, the 0-ring 22 may be omitted, provided the mating surfaces of the interior of the body 28 and the diffuser plate 1 are sufficiently polished to provide an adequate gas seal.

All parts of the gas cell 10 (except for the 0-ring 22) comprise metal, such as stainless steel.

The microchannel plate 24 consists of a 2-dimensional array of holes. While the array may be any size convenient in the practice of MBE growth, as an example, the array comprises 33×33 holes in an area of approximately 1 in². The holes may be formed by any technique capable of producing holes having a small diameter (on the order of 50 μm) relative to the depth (on the order of 300 μm). A presently-available technique is laser drilling. Procedures for laser drilling of holes of such dimensions is known, and thus forms no part of this invention.

Figure 2:
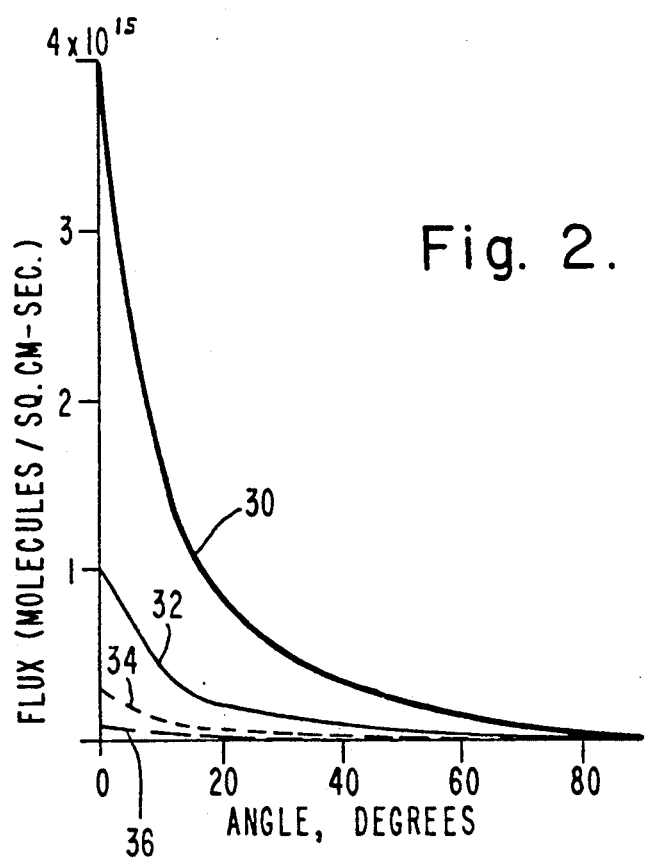
FIG. 2, on coordinates of flux (in molecules/cm$^2$-sec) and angle (in degrees), demonstrates the significant increase in growth rate with decreasing source-to-substrate distance, employing the microchannel plate array assembly of the invention.

The aspect ratio (diameter to depth) of the microchannels determines both the collimation and the resultant flux of the source. The assembly of the source is arranged such that arrays of different aspect ratios and/or channel densities may be easily interchanged. FIG. 2 depicts the calculated flux distribution for a single 50×300 μm channel as a function of source-to-substrate distance using a maximum backing pressure of $10^{-1}$ Torr. Curve 30 represents a source-to-substrate distance of 0.5 cm; Curve 32 represents a distance of 1.0 cm; Curve 34 represents a distance of 2.0 cm; and Curve 36 represents a distance of 5.0 cm.

The microchannel plate array assembly has been incorporated into a GSMBE chamber used to grow silicon. The enhancement of growth rate realized by using the source has been demonstrated. Table I below lists two experiments performed with identical substrate temperatures and gas flow conditions but differing source-to-sample distances. A significant increase in growth rate is observed with decreasing source-to-substrate distance consistent with the beam characteristics of the microchannel plate as illustrated in FIG. 2.

TABLE I

| Growth Rate of Si from $SiH_4$ as a Function of Microchannel Plate-to-Substrate Distance, x. | | | |
|---|---|---|---|
| Substrate T (°C.) | $SiH_4$ Flow (sccm) | x (cm) | Growth Rate (μm/hr) |
| 700 | 50 | 1.3 | 1.6 |
| 700 | 50 | 6.3 | 0.6 |

The volume of the microchannel plate assembly of the invention is significantly smaller than that of a conventional gas source cell. This permits mounting of the microchannel plate assembly on an internal translation device to allow variation of the distance between the microchannel plate and the growth surface. Consequently, the growth rate of the films may be optimized. In contrast, conventional gas source cells are typically fixed in position relative to the substrate.

Thus, there has been provided a uniform collimated gas source cell for gas source molecular beam epitaxial growth of films. It will be apparent to those of ordinary skill in the art that various changes and modifications of an obvious nature may be made. All such changes and modifications are considered to fall within the scope of the invention, as defined by the appended claims.

What is claimed is:

1. A uniform collimated multichannel gas source cell for enhancing a growth rate of films in gas source molecular beam epitaxy comprising:
    an elongated body having a channel for the passage of source gas therethrough;
    a pressure reducing orifice at one end of said body for optimizing effusive flow conditions and a gas outlet at an opposite end;
    a diffuser plate located near said outlet end for reducing beaming effects resulting from reducing gas pressure from a first value outside said cell to a second, lower value in said channel; and
    an interchangeable microchannel plate array located at said outlet end for producing a collimated, high intensity, uniform source gas on said substrate surface, wherein said cell is mounted inside a molecular beam epitaxy chamber on an internal translation device for adjusting a distance between said outlet end of said cell and a substrate surface to enhance the film growth rate.

2. The cell of claim 1 wherein said microchannel plate array comprises a plurality of microchannels in a square array of 33×33 microchannels in about 1 in².

3. The cell of claim 2 wherein said microchannels each have a diameter of about 50 μm and a length of about 300 μm.

4. A microchannel plate array assembly for gas source molecular beam epitaxy comprising:
    an elongated body having a channel extending therethrough from openings at an inlet end and an outlet end which is opposite to said inlet and for the passage of a source gas;
    a fitting for connecting to a gas reservoir, said fitting being located on an outside surface of said elongated body at said inlet end;
    means for automatically controlling pressure of said source gas for optimizing effusive flow conditions through said channel, wherein said pressure is reduced from a first value outside said assembly to a second value at said outlet end;
    a plate for diffusing any effects from the reduced gas pressure located near said outlet end of said assembly;
    a microchannel plate array for collimating the gas into a localized flux on said surface of said substrate, said array being spaced apart from said diffuser plate at said outlet end; and
    means for holding said array in place at said outlet nd, wherein said assembly is mounted within a molecular beam epitaxy chamber on an internal translation device for adjusting a distance between said assembly and a substrate so that a growth rate of a film deposited by said molecular beam epitaxy on said substrate's surface is optimized.

5. The microchannel plate array assembly of claim 4, wherein said fitting is a VCR fitting formed on said outside surface of said body.

6. The microchannel plate array assembly of claim 4, wherein said means for holding said array in place comprise threads on said outside surface of said body at said outlet end and a cap having complementary threads to said threads on said outlet end for securing said cap to said outlet end, said cap having an opening aligned with said channel.

7. The microchannel plate array assembly of claim 4, wherein said array comprises a plurality of microchannels, each microchannel of said array having a first aspect ratio of diameter to depth which determines both collimation and flux localization of said source gas, said array being interchangeable for changing said collimation and flux characteristics.

8. The microchannel plate array assembly of claim 4, wherein said diffuser plate is held in place with a spacer and an O-ring for providing a gas seal at an interface between said diffuser plate and an internal wall of said channel.

9. The microchannel plate array assembly of claim 4, wherein said means for automatically controlling pressure of said source gas comprises a pressure reducing orifice having a first diameter which extends for a first portion of said channel near said inlet end and a second portion of said channel adjacent to said first portion, said second portion having a second diameter which is larger than said first diameter, said automatic pressure controlling means reducing inlet pressure from about 1 atm. to about $10^{-2}$ Torr.

* * * * *

UNITED STATES PATENT AND TRADEMARK OFFICE
CERTIFICATE OF CORRECTION

PATENT NO. : 5,188,671
DATED : February 23, 1993
INVENTOR(S) : J. J. ZINCK ET AL It is certified that error appears in the above-identified patent and that said Letters Patent is hereby corrected as shown below:

Column 4, line 21, delete "and" and insert instead --end--; and line 38, delete "nd" and insert instead --end--.

Signed and Sealed this

Sixth Day of December, 1994

Attest:

BRUCE LEHMAN

*Attesting Officer*  *Commissioner of Patents and Trademarks*